US009861996B2

(12) United States Patent
Higuchi et al.

(10) Patent No.: US 9,861,996 B2
(45) Date of Patent: Jan. 9, 2018

(54) DEPOSITION APPARATUS AND TRAY HOLDER

(71) Applicant: NALUX CO., LTD., Osaka-shi, Osaka (JP)

(72) Inventors: Toshiro Higuchi, Tokyo (JP); Hiroshi Ueno, Otsu (JP); Hitoshi Kimura, Osaka (JP)

(73) Assignee: NALUX CO., LTD., Osaka-Shi, Osaka (JP)

( * ) Notice: Subject to any disclaimer, the term of this patent is extended or adjusted under 35 U.S.C. 154(b) by 27 days.

(21) Appl. No.: 14/620,433

(22) Filed: Feb. 12, 2015

(65) Prior Publication Data
US 2015/0258561 A1 Sep. 17, 2015

(30) Foreign Application Priority Data

Mar. 11, 2014 (JP) .................................. 2014-047654

(51) Int. Cl.
| C23C 16/00 | (2006.01) |
| B05B 13/02 | (2006.01) |
| H01L 21/687 | (2006.01) |
| C23C 14/50 | (2006.01) |
| B05B 12/08 | (2006.01) |

(52) U.S. Cl.
CPC .......... *B05B 13/0242* (2013.01); *B05B 12/08* (2013.01); *C23C 14/505* (2013.01); *H01L 21/68764* (2013.01)

(58) Field of Classification Search
USPC ................... 118/720, 726–728, 50, 500, 730
See application file for complete search history.

(56) References Cited

U.S. PATENT DOCUMENTS

| 3,763,821 A * | 10/1973 | Gorinas ................. C23C 14/50 |
| | | 118/50 |
| 4,378,189 A * | 3/1983 | Takeshita ............... C23C 14/56 |
| | | 118/500 |
| 2011/0247931 A1* | 10/2011 | Tsai ........................ C23C 14/34 |
| | | 204/298.28 |

FOREIGN PATENT DOCUMENTS

| CN | 202181347 U | * | 4/2012 |
| JP | 2009-155683 A | | 7/2009 |
| JP | 2011-179102 A | | 9/2011 |

OTHER PUBLICATIONS

English Translation of JP 2009-155683, Jul. 16, 2009.*
Extended European Search Report dated Jul. 8, 2015, issued in corresponding EP Patent Application No. 15 15 4052.3.

* cited by examiner

*Primary Examiner* — Yewebdar T Tadesse
(74) *Attorney, Agent, or Firm* — Squire Patton Boggs (US) LLP

(57) ABSTRACT

A deposition apparatus includes a deposition source; a rotatable dome provided with an opening which covers the source; a first lever provided outside of the dome; and a tray holder including a frame including a first rotating member and a rotating part including a second rotating member and being attached to the frame such that the rotating part rotates with the second rotating member around an axis supported by the frame. The rotating part includes work-holding trays arranged around the axis, the tray holder is installed on the dome such that a side of one of the trays covers the opening, the first rotating member is rotated by the first lever during rotation of the dome, and the second rotating member is rotated with the rotating part by the first rotating member so as to change the tray a side of which covers the opening to another one.

8 Claims, 17 Drawing Sheets

DEPOSITION APPARATUS AND TRAY HOLDER

BACKGROUND

Field

The present invention relates to a deposition apparatus and a tray holder.

Description of the Related Art

A deposition apparatus is used to form anti-reflection films on a surface of an optical element such as a lens, for example. The deposition apparatus includes a deposition source for supplying a material which is used to form a film, and a dome which covers the deposition source and is rotatable around the central axis. Plural trays are attached to the dome and plural works, for example, lenses are attached to each of the trays.

The process in which works are processed by the above-described deposition apparatus includes a deposition preparation step and a deposition step. The deposition preparation step includes attaching works to the deposition apparatus, preparing the deposition source and generating deposition environment. In the deposition step, material which has been supplied into the deposition environment by the deposition source reaches the works attached to the dome and a film of the material is formed on the works.

By the deposition preparation step, operation of the deposition apparatus is interrupted. Accordingly, downtime of the deposition apparatus due to the deposition preparation step should be reduced in order to increase throughput of the deposition apparatus.

As the prior art, a deposition apparatus in which the dome is divided into plural segments, works are attached on the both sides of each of the segments, and each segment is configured to undergo turnover has been developed (FIGS. 2 and 6 of Patent Document 1, for example). By the above-described mechanism, downtime of the deposition apparatus due to the deposition preparation step can be reduced and the throughput can be increased.

However, in the above-described mechanism, works cannot be arranged at appropriate angles with respect to the deposition source. Accordingly, uniform deposition for plural works cannot be realized. Further, the throughput of the deposition apparatus cannot be increased to a satisfactory level.

Patent Document 1; JP2011-179102

Accordingly, there is a need for a deposition apparatus and tray holder by which the throughput can be further increased while uniform deposition for plural works is realized.

SUMMARY

A deposition apparatus according to a first aspect of the invention includes a deposition source; a rotatable dome which covers the deposition source and is provided with an opening; a first lever provided outside of the dome; and a tray holder which is provided with a frame and a rotating part, the frame being provided with a first rotating member, the rotating part being provided with a second rotating member and being attached to the frame such that the rotating part is capable of rotating together with the second rotating member around an axis supported by the frame. The rotating part is provided with a plurality of work-holding trays arranged around the axis, the tray holder is installed on the dome such that a side of one of the plurality of work-holding trays covers the opening, the first rotating member is configured such that it is rotated by the first lever during rotation of the dome, and the second rotating member is configured such that it is rotated together with the rotating part by the first rotating member so as to change the work-holding tray a side of which covers the opening to another one.

In the deposition apparatus according to the present aspect, the tray holder is provided with a plurality of work-holding trays and the work-holding tray a side of which covers the opening can be changed to another one by rotation of the dome. Accordingly, downtime of the deposition apparatus due to deposition preparation step can be reduced, and therefore throughput of the deposition apparatus can be increased. Further, the shape of the dome does not substantially differ from that of conventional deposition apparatuses, and therefor uniform deposition can be performed as in the case of conventional deposition apparatuses.

A deposition apparatus according to an embodiment of the first aspect of the present invention further includes a first detecting contact installed outside of the dome. The rotating part is further provided with tray indicating contacts each of which corresponds to one of the plurality of work-holding trays and which are to be brought into contact with the first detecting contact during rotation of the dome.

According to the present embodiment, a relative position of a tray in the tray holder can be detected during rotation of the dome. Accordingly, tray change operation in all tray holders installed on the dome can be checked during rotation of the dome.

A deposition apparatus according to another embodiment of the first aspect of the present invention further includes a second lever installed outside of the dome. The rotating part is further provided with third rotating members each of which corresponds to one of the plurality of work-holding trays, each of the plurality of work-holding trays is provided with a fourth rotating member and is attached to the rotating part such that each of the plurality of work-holding trays is capable of rotating together with the fourth rotating member around an axis supported by the rotating part, the third rotating members are configured to rotate by the second lever during rotation of the dome, and the fourth rotating member is configured such that it is rotated together with each of the plurality of work-holding trays by one of the third rotating members so as to turn over each of the plurality of work-holding trays.

In the deposition apparatus according to the present embodiment, each of the plurality of work-holding trays which are attached to the tray holder can be turned over during rotation of the dome. Accordingly, the throughput of the deposition apparatus can be further increased by a method in which works are attached on the both sides of a tray, works attached on one side of the tray are processed, the tray is turned over and after that works attached on the other side of the tray are processed.

A deposition apparatus according to another embodiment of the first aspect of the present invention further includes a second detecting contact installed outside of the dome. Each of the plurality of work-holding trays is further provided with tray-side indicating contacts each of which is to be brought into contact with the second detecting contact during rotation of the dome.

According to the present embodiment, a tray side can be detected during rotation of the dome. Accordingly, tray turnover operation of all tray holders attached to the dome can be checked during rotation of the dome.

A deposition apparatus according to another embodiment of the first aspect of the present invention further includes a third detecting contact installed outside of the dome and a plurality of tray holders. One of the plurality of tray holders is provided with a contact for indicating the home position of rotation, and the contact is to be brought into contact with the third detecting contact during rotation of the dome.

According to the present embodiment, the home position of rotation of the dome can be detected during rotation of the dome. Accordingly, tray change operation and tray turnover operation can be carried out with reliability for all tray holders attached to the dome.

In a deposition apparatus according to another embodiment of the first aspect of the present invention, the rotating part is provided with three work-holding trays.

A tray holder according to a second aspect of the invention tray holder includes a frame and a rotating part, the frame being provided with a first rotating member, the rotating part being provided with a second rotating member and being attached to the frame such that the rotating part is capable of rotating together with the second rotating member around an axis supported by the frame. The rotating part is provided with a plurality of work-holding trays arranged around the axis, and the second rotating member is configured such that it is rotated together with the rotating part by the first rotating member.

When the tray holder according to the present aspect is installed at an opening of a dome of a deposition apparatus, the work-holding tray a side of which covers the opening can be changed to another one by rotation of the dome. Accordingly, downtime of the deposition apparatus due to deposition preparation step can be reduced, and therefore throughput of the deposition apparatus can be increased.

DETAILED DESCRIPTION

Figure 1:
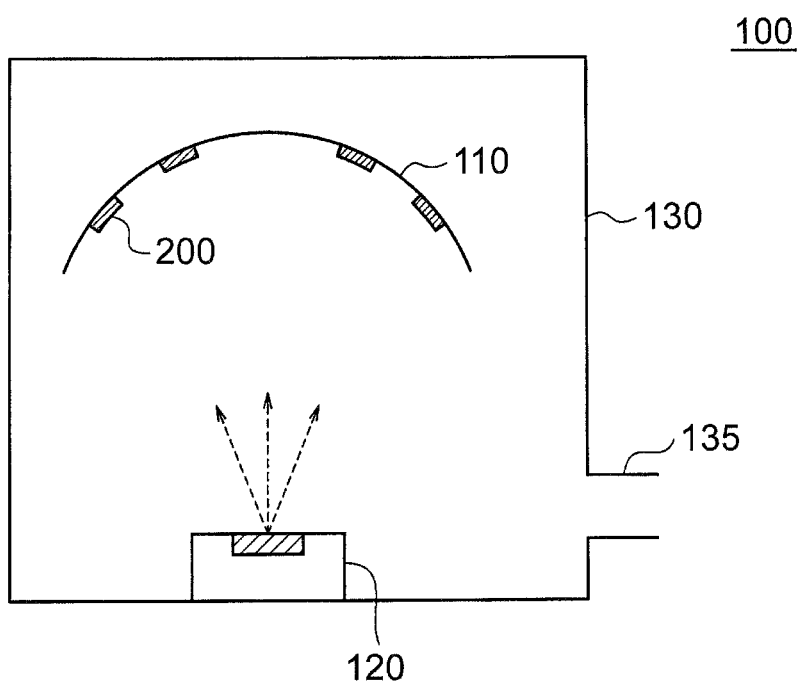
FIG. 1 shows a construction of a deposition apparatus according to the present invention.

FIG. 1 shows a construction of a deposition apparatus 100 according to the present invention. The deposition apparatus 100 includes a deposition source 120, a dome 110 and a chamber 130 which encloses them. The chamber 130 is evacuated using an exhaust hole 135 and a predetermined degree of vacuum is maintained inside it. The dome 110 is configured such that works 200 can be attached to the inner wall of it and is installed such that it covers the deposition source 120. A material which has been emitted by the deposition source 120 reaches the works 200 attached to the inner wall of the dome 110 and is disposed onto surfaces of the works. During the deposition process the dome 110 is rotated around the central axis by a driving section not shown in the drawing so as to realize uniform deposition among the plural works 200 attached to the inner wall of the dome 110. The works 200 are optical elements such as lenses, for example, and are attached to trays attached to the inner wall of the dome 110. The trays are not shown in the drawing. The descriptions given above are commonly applied to the deposition apparatus 100 according to the present invention and conventional deposition apparatuses. The characteristic construction of the deposition apparatus 100 according to the present invention will be described below.

Figure 2:
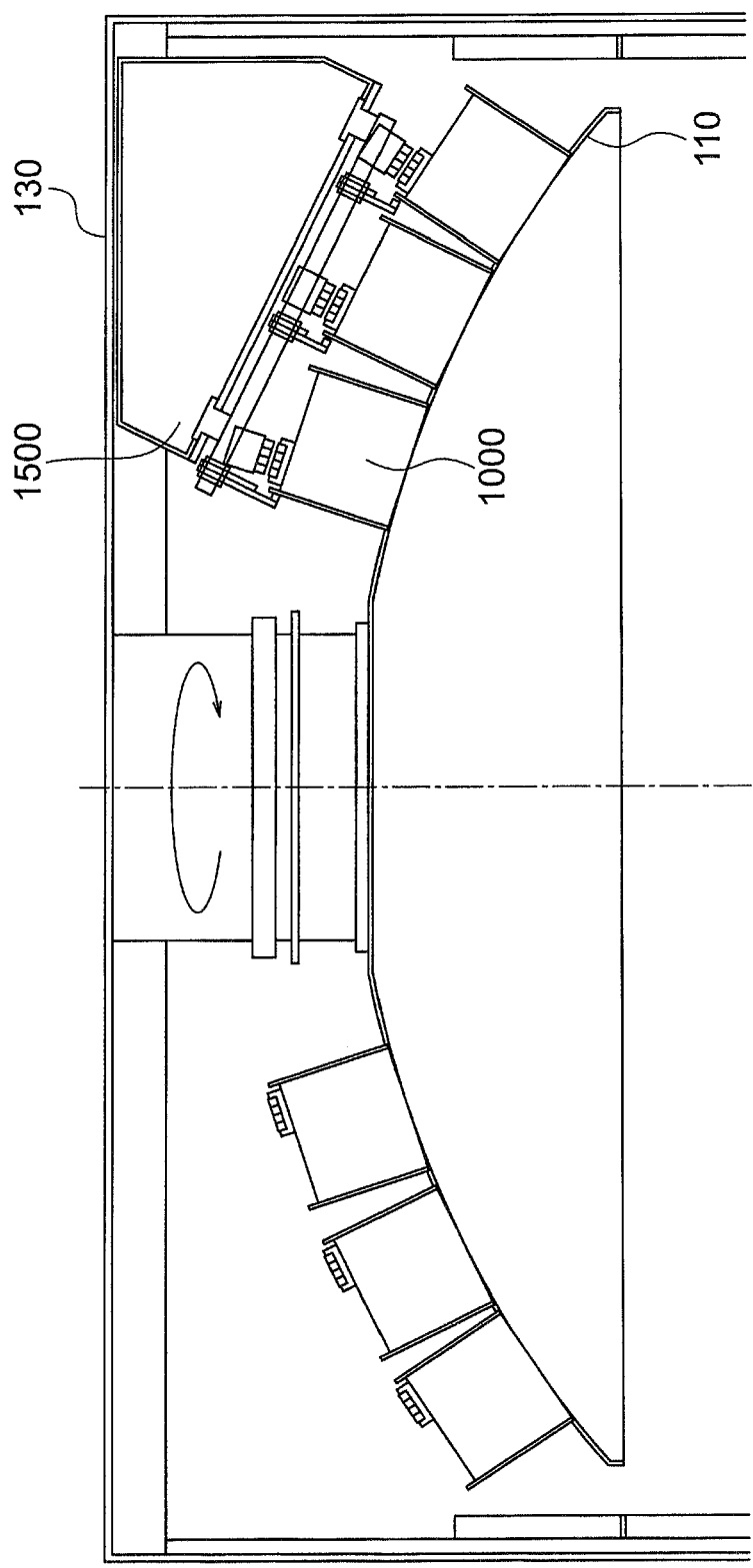
FIG. 2 illustrates the characteristic construction of the deposition apparatus according to the present invention.

FIG. 2 illustrates the characteristic construction of the deposition apparatus 100 according to the present invention. The deposition apparatus 100 according to the present invention is provided with a tray holder 1000 which is installed on the outer wall of the dome 110. The tray holder 1000 is provided with plural trays for holding works, and is configured such that one of the trays is set to an opening provided on the dome 110. By setting each of the plural trays for holding works to the opening of the dome 110 one after another, a great number of works can be processed more efficiently than in the case of conventional deposition apparatuses in which the trays for holding works are fixed onto the inner wall of the dome. The process will be described in detail later.

The deposition apparatus 100 according to the present invention is provided with a fixed mechanism 1500 attached to the chamber. The fixed mechanism 1500 interacts with the tray holder 1000 which rotates together with the dome around the central axis. Interaction of the tray holder 1000 and the fixed mechanism 1500 will be described in detail later.

Figure 3:
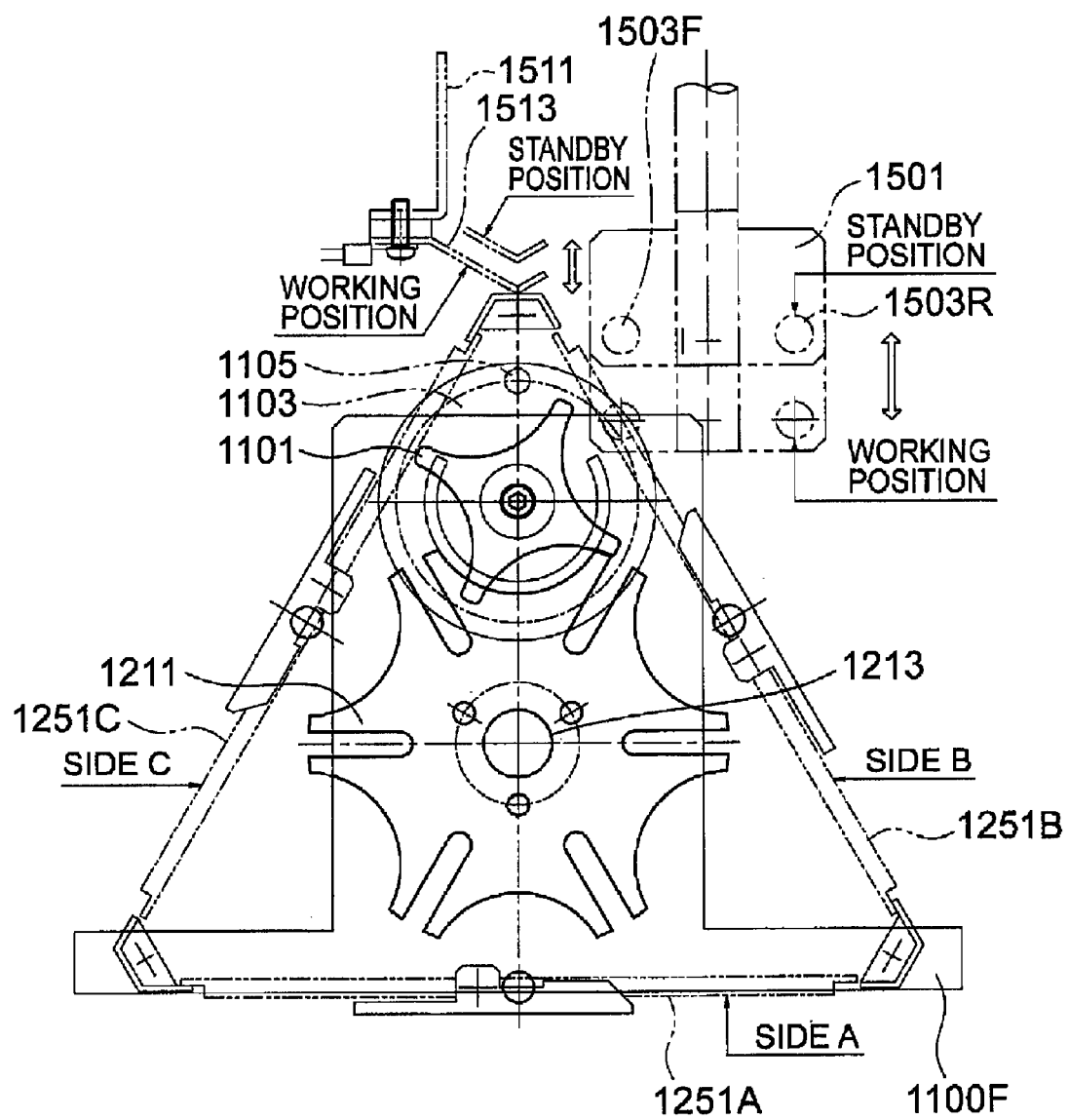
FIG. 3 shows a front view of the tray holder.

FIG. 3 shows a front view of the tray holder 1000.

Figure 4:
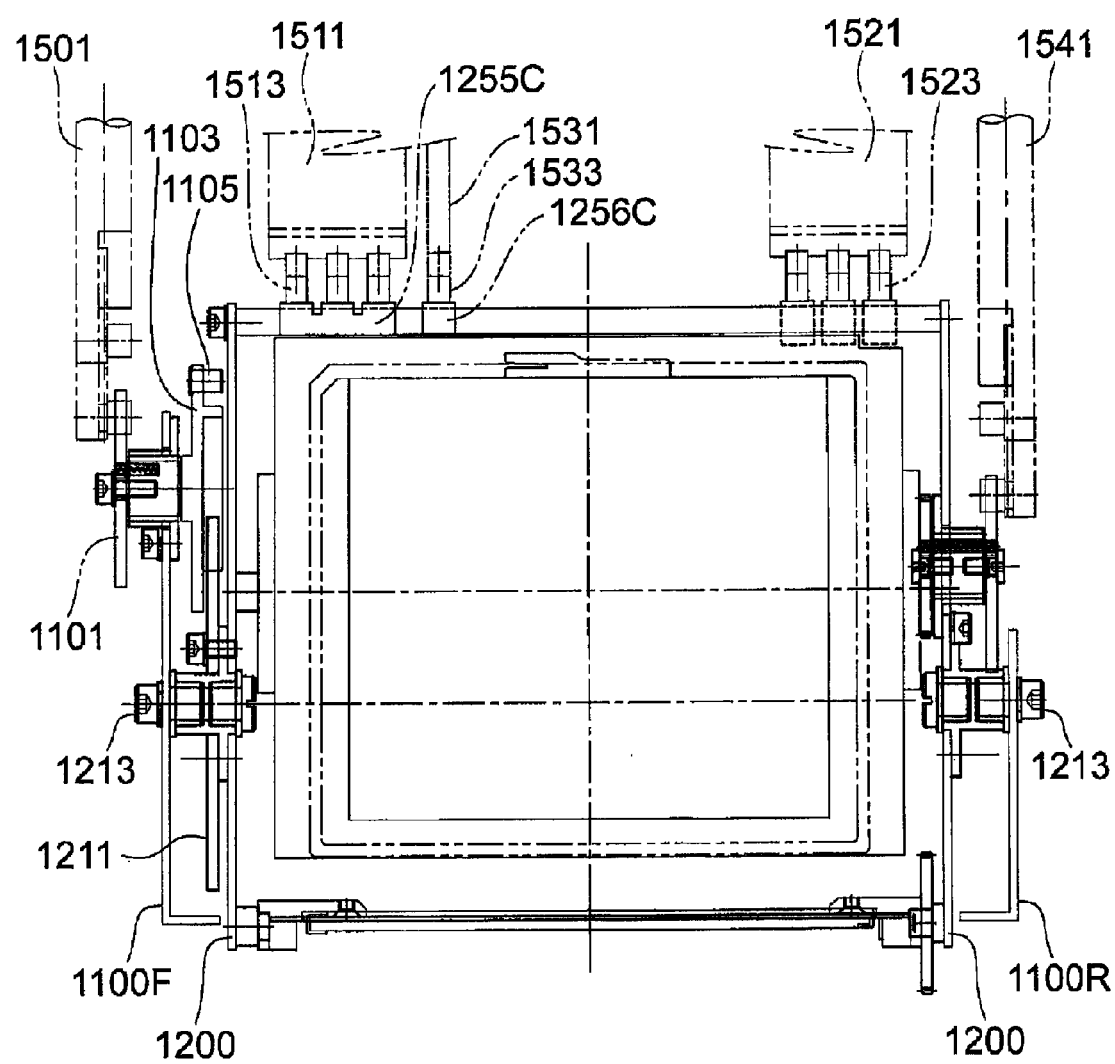
FIG. 4 shows a side view of the tray holder.

FIG. 4 shows a side view of the tray holder 1000.

Figure 5:
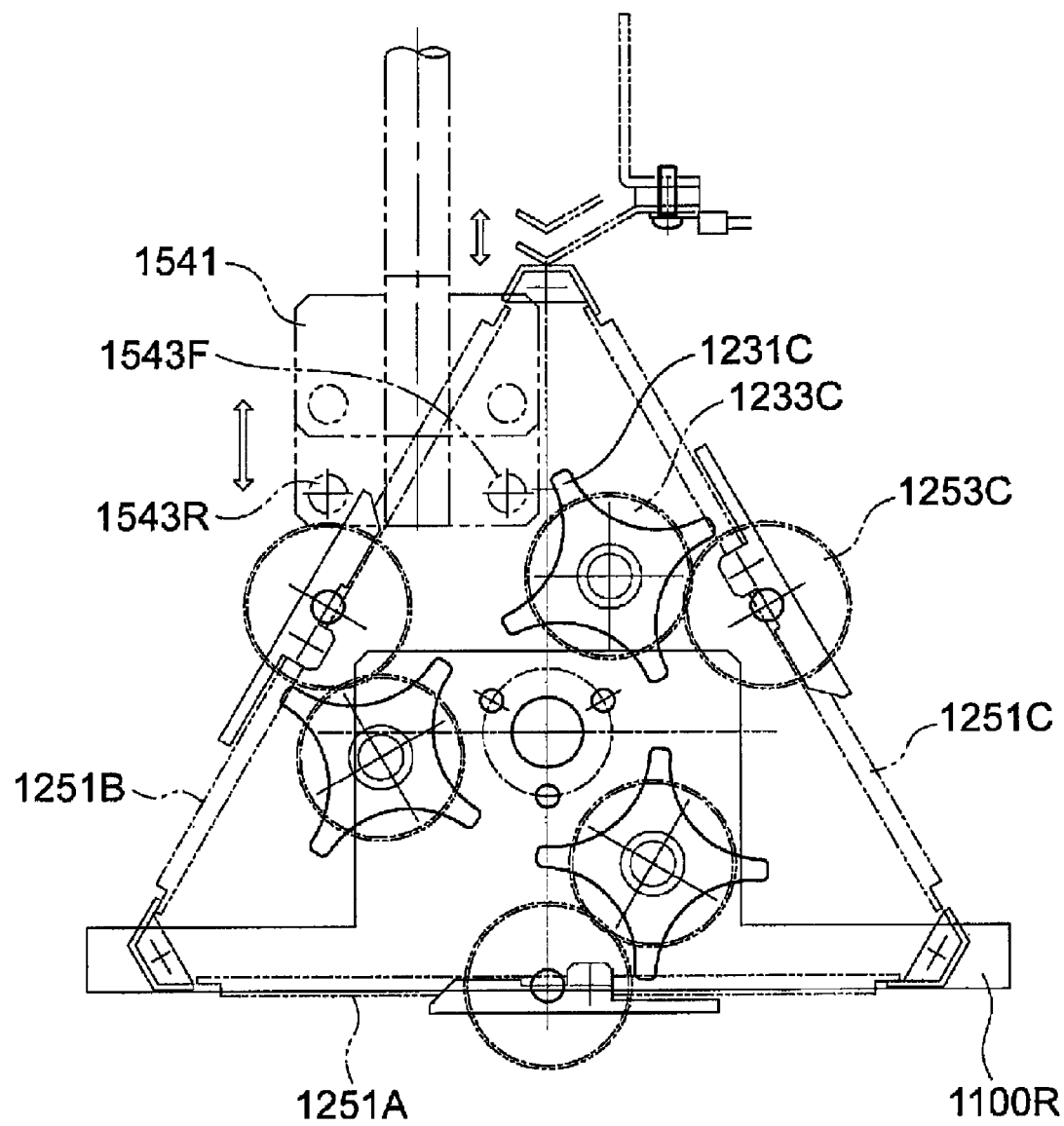
FIG. 5 shows a rear view of the tray holder.

FIG. 5 shows a rear view of the tray holder 1000.

The tray holder 1000 includes a frame 1100F, 1100R and a rotating part 1200. As shown in FIG. 3, in the front of the frame 1100F a first group of rotating members which includes a gear wheel 1101 and a rotating plate 1103 is installed. The gear wheel 1101 and the rotating plate 1103 rotate as an integral whole. The rotating plate 1103 is provided with a pin 1105. The rotating part 1200 includes a tray 1251A, a tray 1251B, a tray 1251C and a Geneva gear 1211. As shown in FIG. 4, the rotating part 1200 is configured to rotate around an axis 1213 which is supported by the frame 1100F, 1100R. When the rotating plate 1103 rotates, the pin 1105 is engaged with a slot of the Geneva gear 1211 and the Geneva gear 1211 is rotated around the axis 1213.

The rotating part 1200 is rotated together with the Geneva gear 1211. Thus, the rotating part 1200 is rotated around the axis 1213.

The fixed mechanism 1500 includes a first lever holding section 1501 which is provided with a lever 1503F and a lever 1503R. When the first lever holding section 1501 is in the standby position, the lever 1503F and the lever 1503R will not be brought into contact with the gear wheel 1101 of the front of the frame 1100F during rotation of the dome 110. When the first lever holding section 1501 is in the working position, the lever 1503F and the lever 1503R will be brought into contact with the gear wheel 1101 of the front of the frame 1100F, and thus will rotate the gear wheel 1101 during rotation of the dome 110. Thus, when the lever 1503F and the lever 1503R rotate the gear wheel 1101 during rotation of the dome 110, the rotation part 1200 provided with the Geneva gear 1211 is rotated. By the rotation of the rotation part 1200, a tray which is to be set to an opening of the dome 110 can be changed. Tray change operation using the rotation of the rotation part 1200 will be described later.

As shown in FIG. 5, the rotating part 1200 includes three sets of second rotating members, each of which corresponds to a tray 1251A, a tray 1251B and a tray 1251C, respectively. For example, the second rotating member which corresponds to the tray 1251C includes a gear wheel 1231C and a rotating plate 1233C. The gear wheel 1231C and the rotating plate 1233C rotate as an integral whole. The tray 1251C is provided with a rotating plate 1253C and is attached such that it can rotate around an axis which is supported by the rotating part 1200. The rotating plate 1233C and the rotating plate 1253C are gear-engaged with each other, and therefore the tray 1251C provided with the rotating plate 1253C is rotated when the gear wheel 1231C rotates.

The fixed mechanism 1500 includes a second lever holding section 1541 which is provided with a lever 1543F and a lever 1543R. When the first lever holding section 1541 is in the standby position, the lever 1543F and the lever 1543R will not be brought into contact with the gear wheel 1231C of the rotating part 1200 during rotation of the dome 110. When the second lever holding section 1541 is in the working position, the lever 1543F and the lever 1543R will be brought into contact with the gear wheel 1231C of the rotating part 1200 and thus will rotate the gear wheel 1231C during rotation of the dome 110. Thus, when the lever 1543F and the lever 1543R rotate the gear wheel 1231C during rotation of the dome 110, the tray 1251C provided with the rotating plate 1253C is rotated. By the rotation of the tray 1251C, the outer side and the inner side of the tray can be changed. The change of the outer side and the inner side of a tray is referred to as turnover of the tray. Tray turnover operation using rotation of the tray will be described later.

Figure 6:
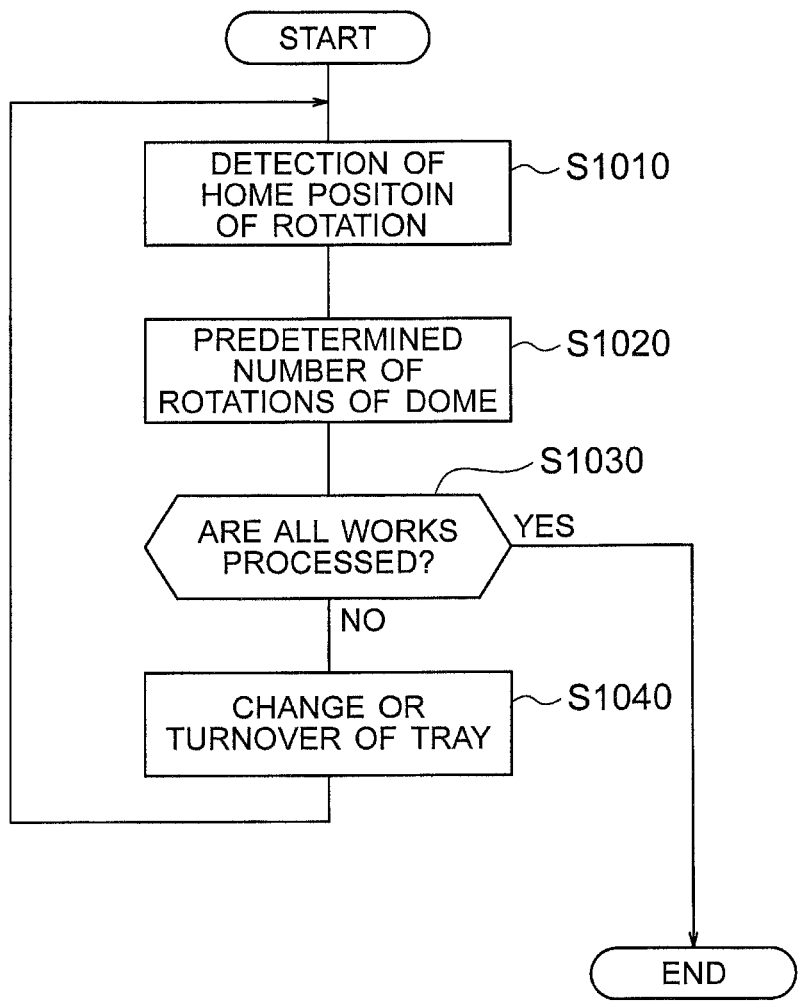
FIG. 6 is a flow chart for illustrating operation of deposition of the deposition apparatus according to the present invention.

FIG. 6 is a flow chart for illustrating operation of deposition of the deposition apparatus 100 according to the present invention.

In step S1010 of FIG. 6, the home position of rotation is detected. Detection of the home position of rotation will be described later.

In step S1020 of FIG. 6, the dome 110 is rotated a predetermined times. During the rotation a desired film is formed on works by the deposition process. The rotational speed of the dome 110 during the deposition is 10 revolutions per minute (10 rpm), for example.

In step S1030 of FIG. 6, it is determined whether or not process of the works on all sides has been completed. If process of the works on all sides has been completed, the operation of deposition is completed. If process of any works has not been completed, the process goes to step S1040.

In step S1040 of FIG. 6, at least one of tray change operation and tray turnover operation is carried out. Then, the process returns to step S1010. Tray change operation and tray turnover operation can be carried out in any sequence. As described above, tray change operation and tray turnover operation are carried out during rotation of the dome 110. The rotational speed of the dome 110 during tray change operation and tray turnover operation is 2 revolutions per minute (2 rpm), for example. Tray change operation and tray turnover operation will be described later in detail.

When the deposition apparatus 100 is not provided with a tray turnover mechanism, or when the deposition apparatus 100 is provided with the tray turnover mechanism, but works are attached to a single side of trays alone, turnover of trays is not carried out.

Figure 7:
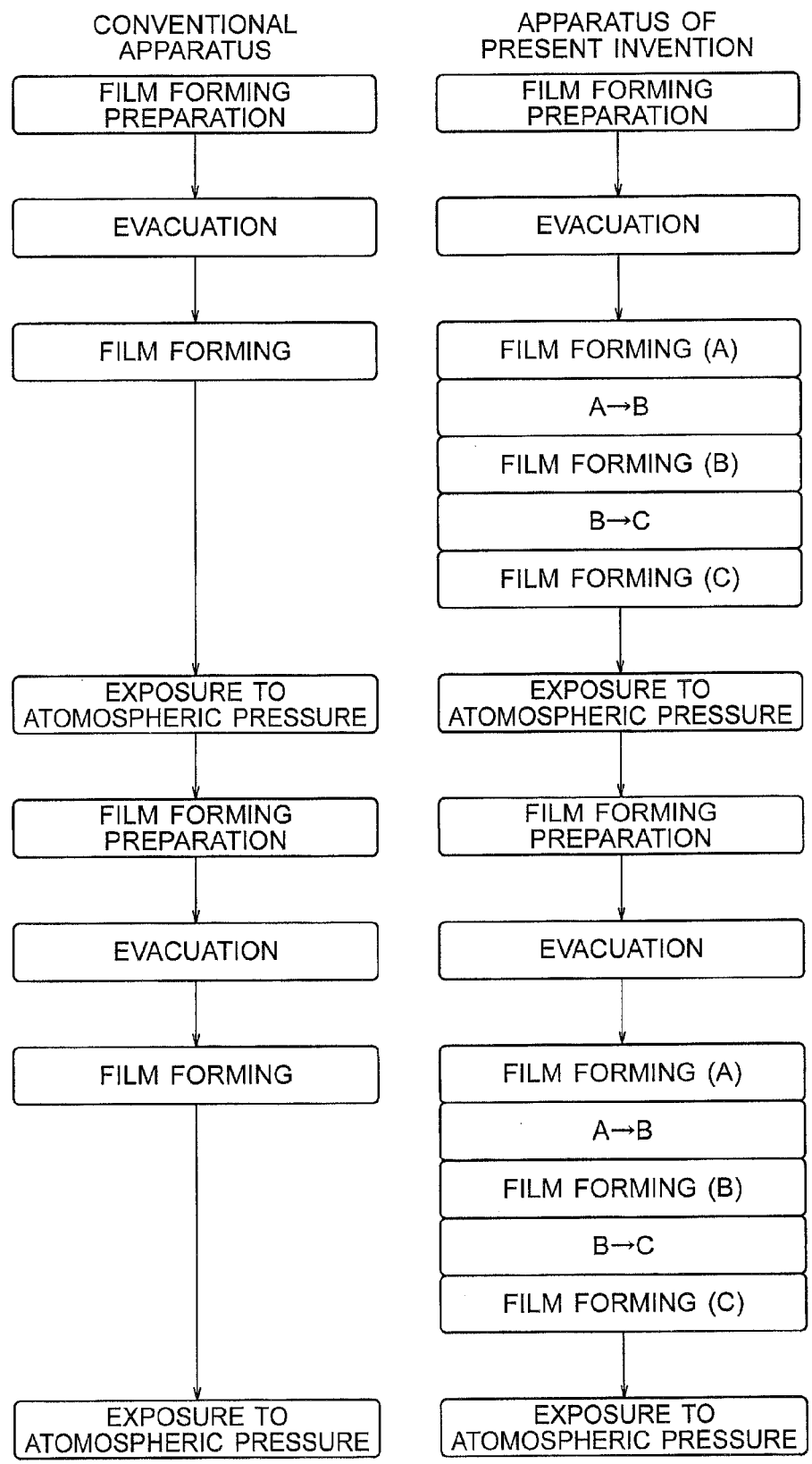
FIG. 7 illustrates deposition preparation step and deposition step of a conventional deposition apparatus and the deposition apparatus according to the present invention.

FIG. 7 illustrates deposition preparation step and deposition step of a conventional deposition apparatus and those of the deposition apparatus according to the present invention.

When a conventional deposition apparatus is used, the following steps are carried out in the order described below.

| | |
|---|---|
| 1) Film-forming preparation step | 7 minutes |
| 2) Evacuation step | 22 minutes |
| 3) Film-forming step (deposition step) | 23 minutes |
| 4) Step of exposure to atmospheric pressure | 13 minutes |

Steps 1), 2) and 4) are included in the deposition preparation step. Time periods described above show values of duration of respective steps. The film-forming preparation step includes preparation of the deposition source 120. The evacuation step includes evacuating the chamber 130 using the exhaust hole 135 and realizing a predetermined degree of vacuum inside the chamber. The film-forming step includes deposition process. The step of exposure to atmospheric pressure includes exposing the chamber 130 to the atmospheric pressure.

When the deposition apparatus 100 according to the present invention is used, the following steps are carried out in the order described below.

| | |
|---|---|
| 1) Film-forming preparation step | 7 minutes |
| 2) Evacuation step | 22 minutes |
| 3) Film-forming step (tray A) | 23 minutes |
| 4) Change from tray A to tray B | 3 minutes |
| 5) Film-forming step (tray B) | 23 minutes |
| 6) Change from tray B to tray C | 3 minutes |
| 7) Film-forming step (tray C) | 23 minutes |
| 8) Step of exposure to atmospheric pressure | 13 minutes |

Steps 1), 2), 4), 6) and 8) are included in the deposition preparation step. The film-forming preparation step, the evacuation step, the film-forming step and the step of exposure to atmospheric pressure are identical with those in the case that the conventional deposition apparatus is used.

The throughput is represented as a ratio of the time required for the deposition step to the whole time (the time required for the deposition step and the deposition preparation step). The throughput of the conventional deposition apparatus and the throughput of the deposition apparatus 100 according to the present invention will be compared. The throughput of the conventional deposition apparatus is as below.

$$23/(7+22+23+13)=35.4\%$$

The throughput of the deposition apparatus 100 according to the present invention is as below.

$$(23\times3)/(7+22+23\times3+3\times2+13)=59.0\%$$

Thus, the throughput is remarkably increased by the use of the deposition apparatus 100 according to the present invention.

Tray change operation using rotation of the rotating section 1200, which is shown in step S1040 in FIG. 6 will be described below.

Figure 8:
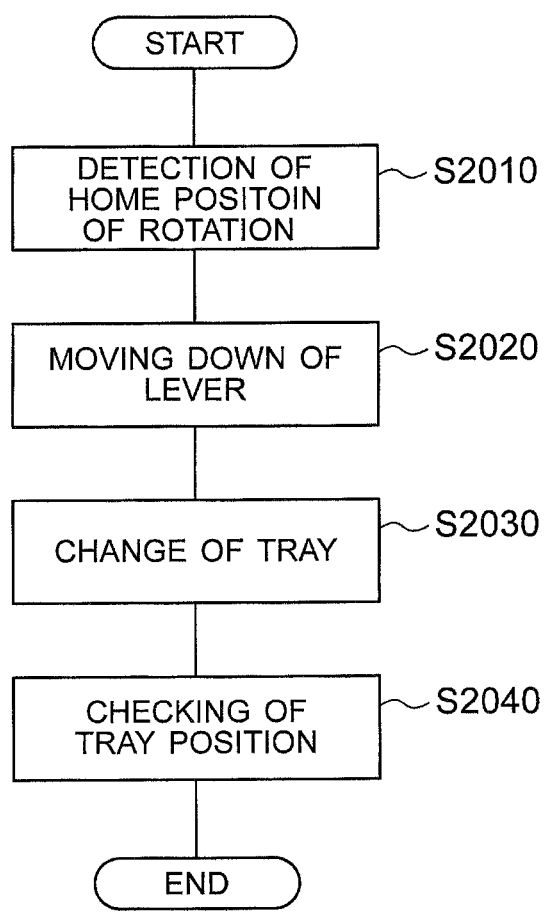
FIG. 8 is a flowchart for illustrating tray change operation using rotation of the rotating section.

FIG. 8 is a flowchart for illustrating tray change operation using rotation of the rotating section 1200.

In step S2010 of FIG. 8, the home position of rotation is detected. Detection of the home position of rotation will be described later.

In step S2020 of FIG. 8, the first lever holding section 1501 is moved down from the standby position to the working position as shown in FIG. 3. As a result, the lever 1503F and the lever 1503R are to be brought into contact with the gear wheel 1101 installed in the front of the frame 1100F during rotation of the dome 110.

In step S2030 of FIG. 8, the rotating part 1200 is rotated by 120 degrees, and therefore the tray which is set to an opening of the dome 110 is changed from the tray 1251A to the tray 1251B.

FIGS. 10A to 10L illustrate how the rotating part 1200 is rotated by 120 degrees.

Figure 10A:
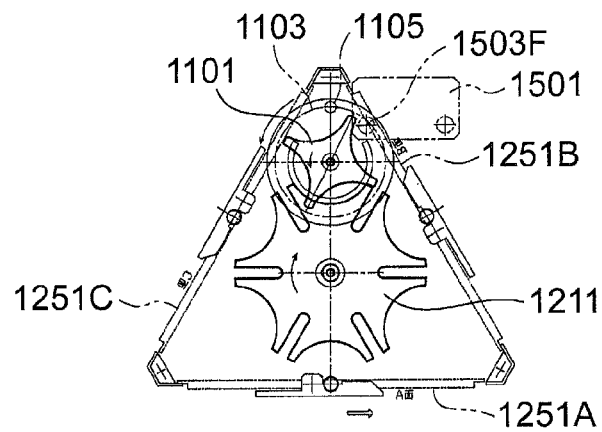
FIGS. 10A to 10L illustrate how the rotating part is rotated by 120 degrees.

FIG. 10A shows the state in which the lever 1503F is not yet brought into contact with the gear wheel 1101.

Figure 10B:
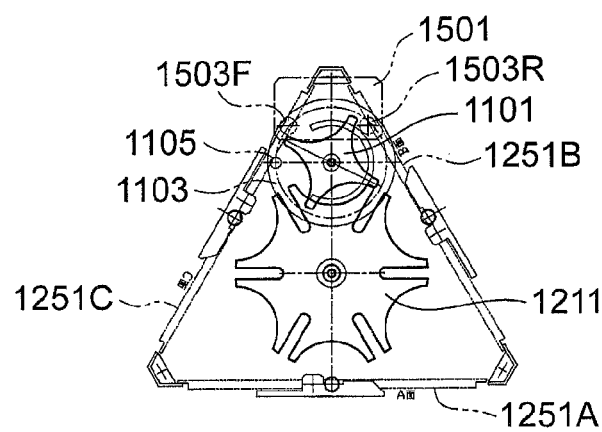

FIG. 10B shows the state in which the lever 1503F has been brought into contact with the gear wheel 1101 and has rotated the gear wheel 1101 and the rotating plate 1103 by 90 degrees In FIGS. 10A to 10L, each of which shows the front side of the rotating part 1200, the levers move leftward.

Figure 10C:
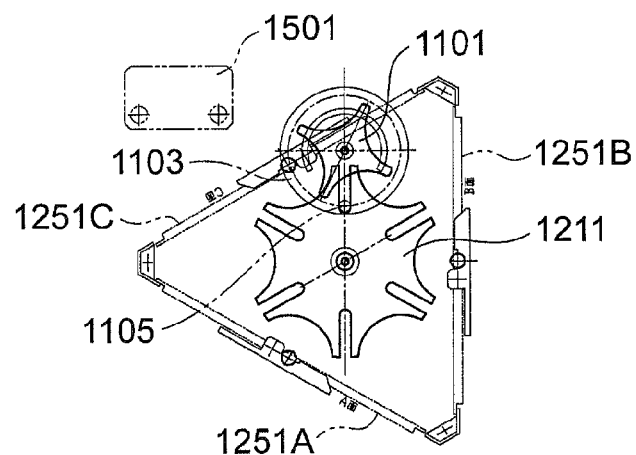

FIG. 10C shows the state in which the lever 1503R has been brought into contact with the gear wheel 1101 and has rotated the gear wheel 1101 and the rotating plate 1103 further by 90 degrees. The pin 1105 of the rotating plate 1103 has been engaged with a slot of the Geneva gear 1211 and has rotated the Geneva gear 1211 by 30 degrees.

As shown in FIGS. 10A to 10C, the levers 1503F and 1503R rotate the rotating plate 1103 by 180 degrees and make the Geneva gear 1211 rotate by 30 degrees.

Figure 10D:
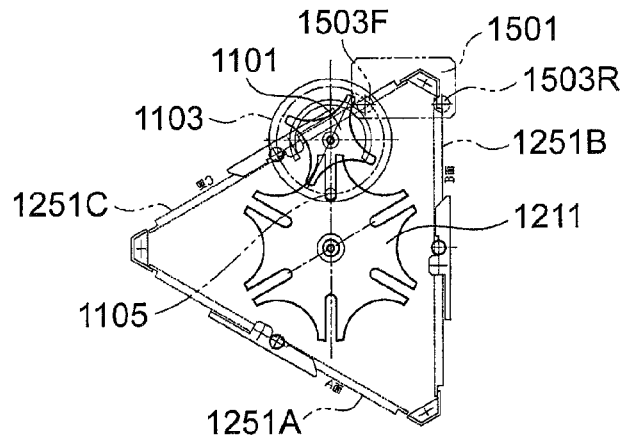
Figure 10E:
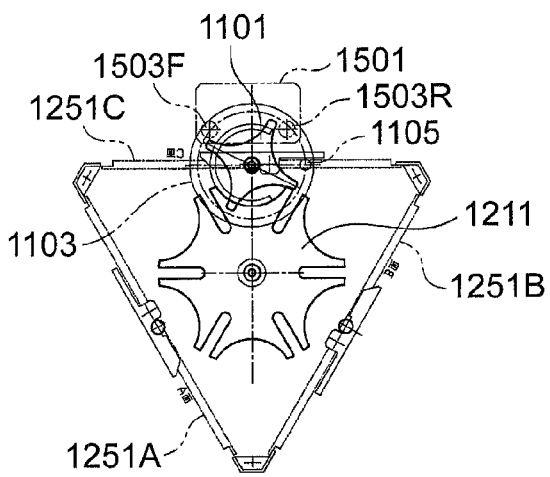
Figure 10F:
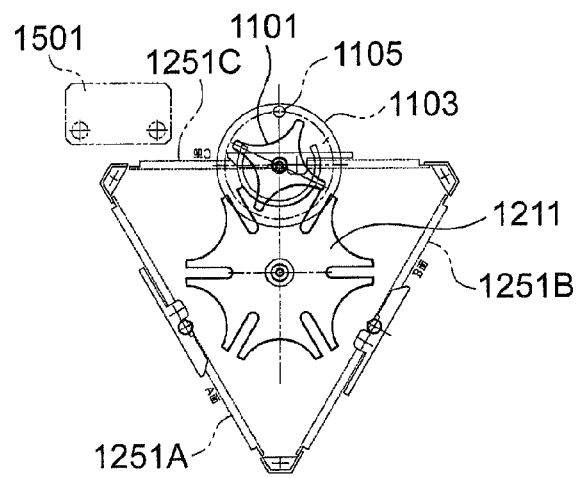

As shown in FIGS. 10D to 10F, another rotation of the dome 110 makes the levers 1503F and 1503R further rotate the rotating plate 1103 by 180 degrees and thereby makes the Geneva gear 1211 further rotate by 30 degrees.

Figure 10G:
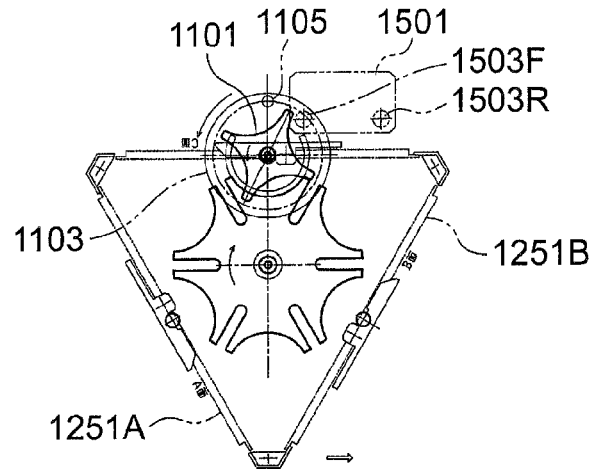
Figure 10H:
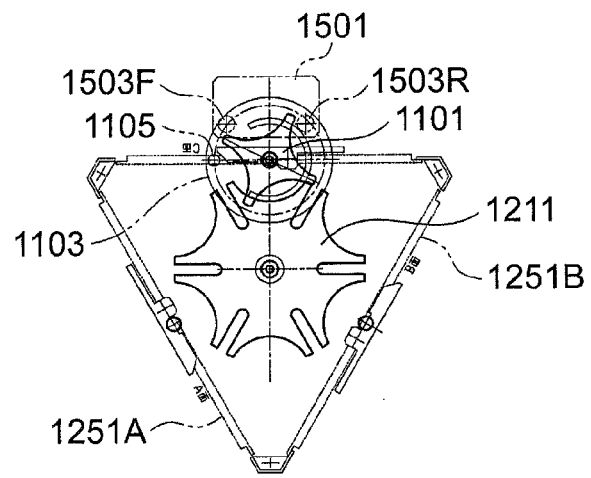
Figure 10I:
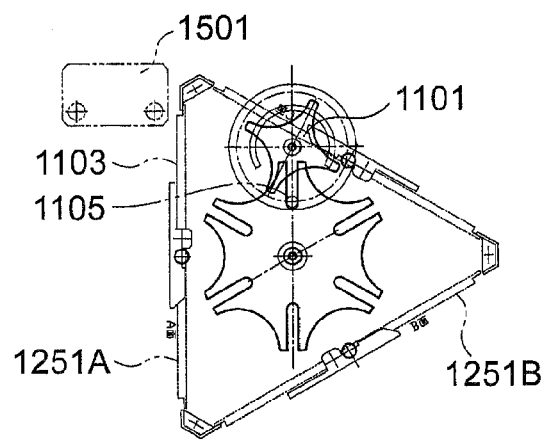

As shown in FIGS. 10G to 10I, another rotation of the dome 110 makes the levers 1503F and 1503R further rotate the rotating plate 1103 by 180 degrees and thereby makes the Geneva gear 1211 further rotate by 30 degrees.

Figure 10J:
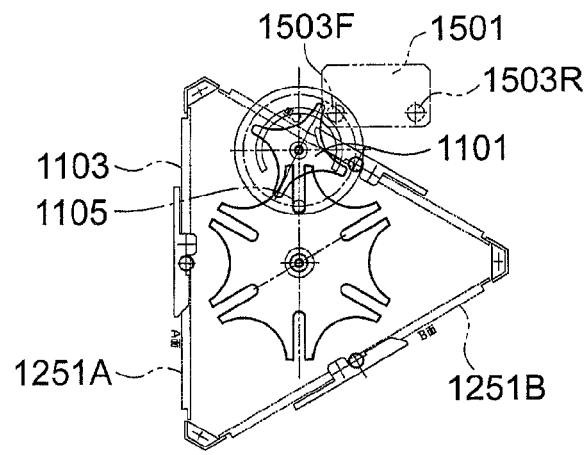
Figure 10K:
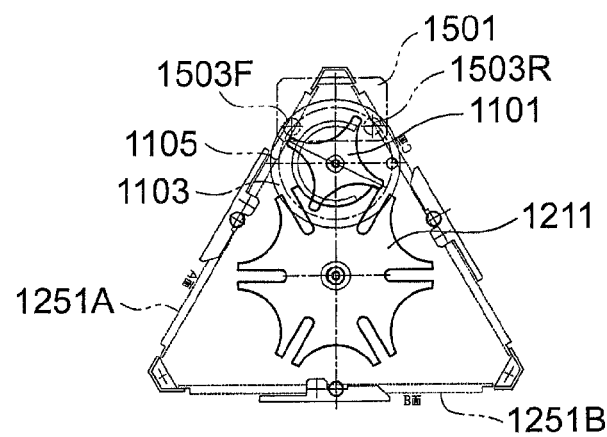
Figure 10L:
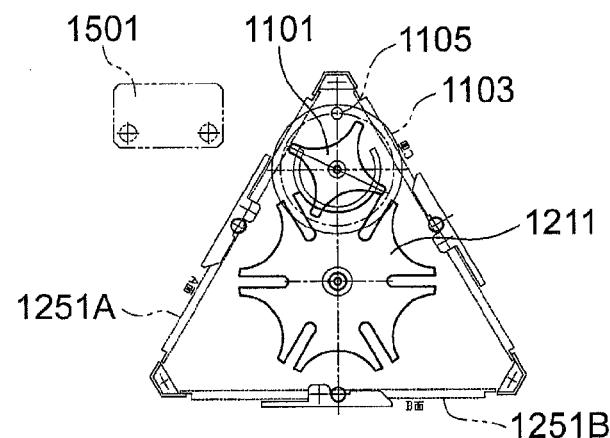

As shown in FIGS. 10J to 10L, another rotation of the dome 110 makes the levers 1503F and 1503R further rotate the rotating plate 1103 by 180 degrees and thereby makes the Geneva gear 1211 further rotate by 30 degrees.

Thus, a total of four rotations of the dome 110 make the rotating part 1200 by 120 degrees so that the tray which is set to an aperture of the dome is changed from tray 1251A to tray 1251B.

In step S2040 of FIG. 8, the tray is identified and the position of the tray is checked. Identification of a tray will be described later.

Tray turnover operation, which is shown in step S1040 in FIG. 6 will be described below.

Figure 9:
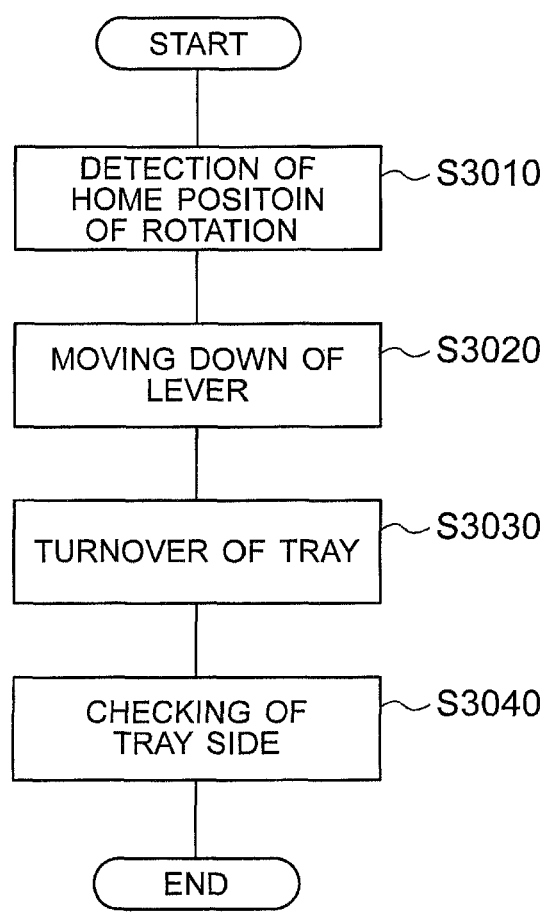
FIG. 9 is a flowchart for illustrating tray turnover operation.

FIG. 9 is a flowchart for illustrating tray turnover operation.

In step S3010 of FIG. 9, the home position of rotation is detected. Detection of the home position of rotation will be described later.

In step S3020 of FIG. 9, the second lever holding section 1541 is moved down from the standby position to the working position as shown in FIG. 5. As a result, the lever 1543F and the lever 1543R are to be brought into contact with the gear wheel 1231A, 1231B or 1231C installed in the rotation part 1200 during rotation of the dome 110.

In step S3030 of FIG. 9, the tray is rotated by 180 degrees.

Figure 11A:
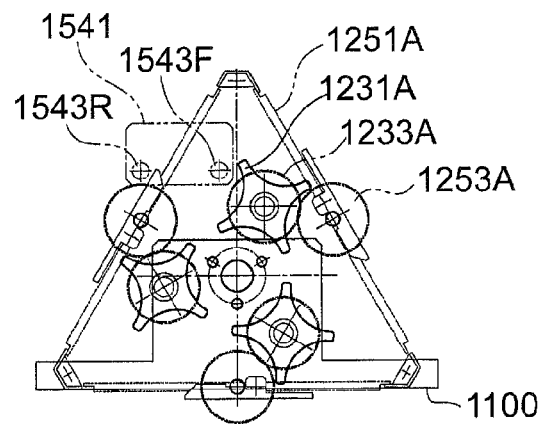
FIGS. 11A to 11C illustrate how the tray is rotated by 180 degrees.
Figure 11B:
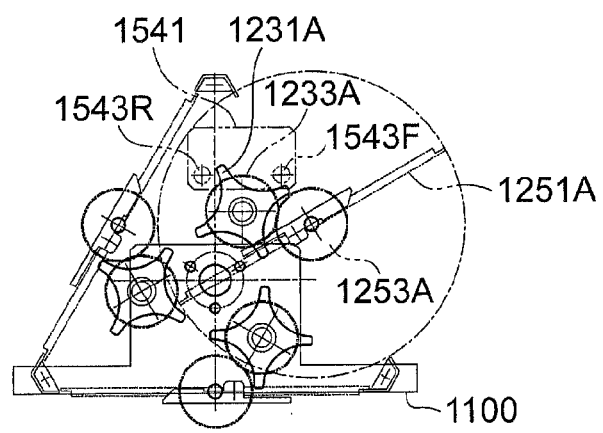
Figure 11C:
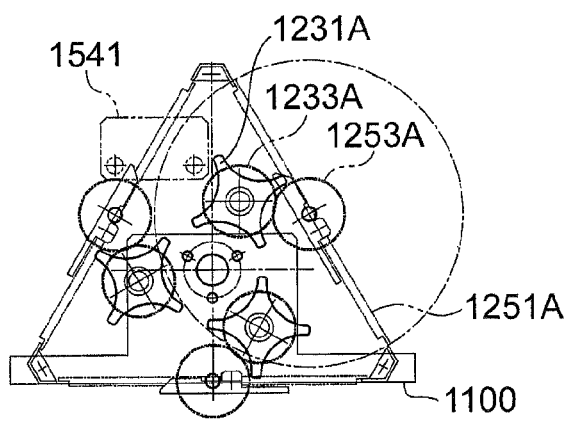

FIGS. 11A to 11C illustrate how the tray 1253A is rotated by 180 degrees.

FIG. 11A shows the state in which the lever 1543F is not yet brought into contact with the gear wheel 1231A.

FIG. 11B shows the state in which the lever 1543F has been brought into contact with the gear wheel 1231A, and thus has rotated the gear wheel 1231A and the rotating plate 1233A by 90 degrees. When the rotating plate 1233A is rotated by 90 degrees, the rotating plate 1253A which is gear-engaged with the rotating plate 1233A is also rotated by 90 degrees, and therefore the tray 1251A is also rotated by 90 degrees. In FIG. 11B, the lever 1543R is not yet brought into contact with the gear wheel 1231A

In FIGS. 10A to 10L, each of which shows the front side of the rotating part 1200, the levers move leftward as described above, while in FIGS. 11A to 11C, each of which shows the rear side of the rotating part 1200, the levers move rightward.

FIG. 11C shows the state in which the lever 1543R has been brought into contact with the gear wheel 1231A, and thus has rotated the gear wheel 1231A and the rotating plate 1233A further by 90 degrees.

Thus, one rotation of the dome 110 makes the tray rotate by 180 degrees.

In step S3040 of FIG. 9, the tray side is identified and checked. Identification of a tray side will be described later.

Identification of a tray, identification of a tray side and detection of the home position of rotation will be described below.

Figure 12:
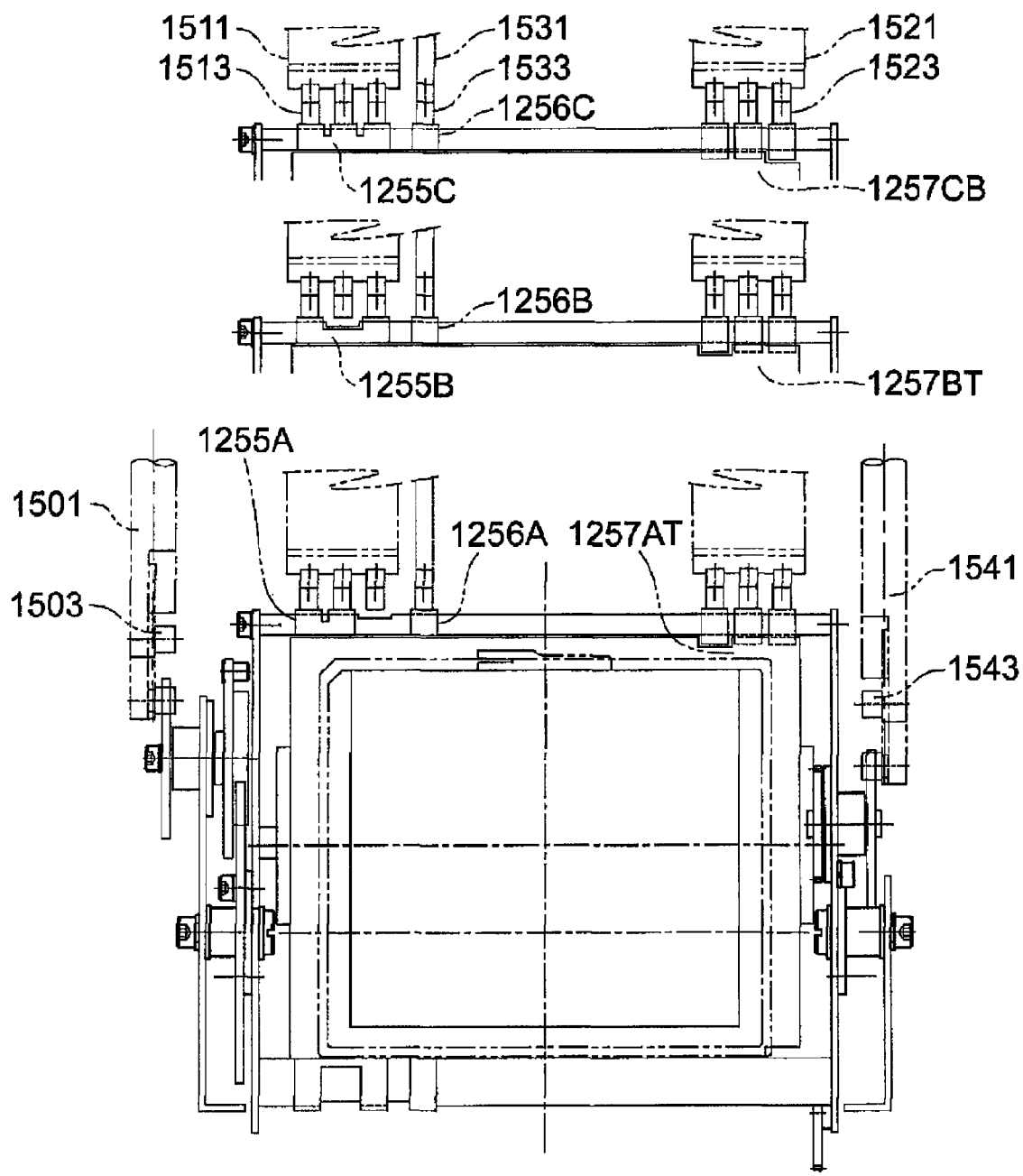
FIG. 12 illustrates identification of a tray, identification of a tray side and detection of the home position of rotation.

FIG. 12 illustrates identification of a tray, identification of a tray side and detection of the home position of rotation.

The trays 1251A, 1251B and 1251C are respectively provided with tray indicating contacts 1255A, 1255B and 1255C. The fixed mechanism 1500 is provided with a first contact-holding section 1511 and three detecting contacts 1513 which are attached to the first contact-holding section 1511. As shown in FIG. 3, when the first contact-holding section 1511 is in the working position, one of the three detecting contacts 1513 is to be brought into contact with one of the tray indicating contacts 1255A, 1255B and 1255C during rotation of the dome 110. The tray indicating contacts 1255A, 1255B and 1255C are differently shaped such that each of them is to be brought into contact with only one of the three detecting contacts 1513. Accordingly, by finding which detecting contact is in contact with one of the tray indicating contacts, one of the three trays can be identified.

The trays 1251A, 1251B and 1251C are respectively provided with two tray-side indicating contacts 1257AT and 1257AB, 1257BT and 1257BB and 1257CT and 1257CB. The fixed mechanism 1500 is provided with a second contact-holding section 1521 and three detecting contacts 1523 which are attached to the second contact-holding section 1521. When the second contact-holding section 1521 is in the working position, any of the three detecting contacts 1523 are to be brought into contact with the tray-side indicating contact 1257AT or 1257AB, for example, during rotation of the dome 110. The tray-side indicating contacts 1257AT and 1257AB are differently shaped such that each of them is to be brought into contact with only some of the three detecting contacts 1523. Accordingly, by finding which detecting contact is in contact with one of the tray-side indicating contacts, a tray side can be identified. The number of the detecting contacts for identifying a tray side may be two.

The three trays 1251A, 1251B and 1251C of one of the tray holders 1000 installed on the dome 110 are respectively provided with contacts 1256A, 1256B and 1256C for indicating the home position of rotation. The fixed mechanism 1500 is provided with a third contact-holding section 1531 and a detecting contact 1533 which is attached to the third contact-holding section 1531. When the third contact-holding section 1531 is in the working position, the detecting contact 1533 is to be brought into contact with the contact 1256A, the contact 1256B or the contact 1256C for indicating the home position of rotation during rotation of the dome 110. Thus, the home position of rotation of the dome 110 can be detected.

Figure 13:
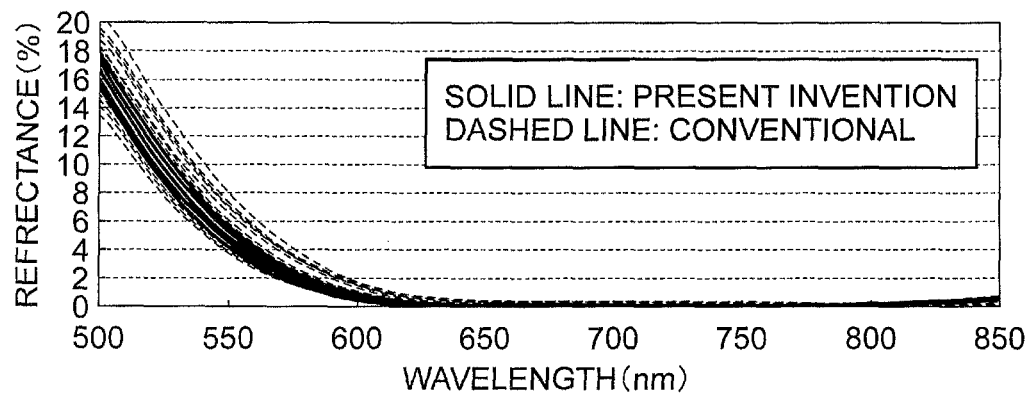
FIG. 13 shows relationships between wavelength and reflectance of light of optical elements provided with films on surfaces thereof, which have been formed by a deposition apparatus according to the present invention and optical elements provided with films on surfaces thereof, which have been formed by a conventional deposition apparatus.

FIG. 13 shows relationships between wavelength and reflectance of light of optical elements provided with films on surfaces thereof, which have been formed by a deposition apparatus according to the present invention and optical elements provided with films on surfaces thereof, which have been formed by a conventional deposition apparatus. The horizontal axis of FIG. 13 represents wavelength of light, while the vertical axis represents reflectance. In FIG. 13, solid lines represent relationships between wavelength and reflectance of light of optical elements provided with films on surfaces thereof, which have been formed by a deposition apparatus according to the present invention, while dashed lines represent relationships between wavelength and reflectance of light of optical elements provided with films on surfaces thereof, which have been formed by a conventional deposition apparatus. According to FIG. 13, reflectance distributions over wavelengths of optical elements provided with films on surfaces thereof, which have been formed by a deposition apparatus according to the present invention do not substantially differ from reflectance distributions over wavelengths of optical elements provided with films on surfaces thereof, which have been formed by a conventional deposition apparatus.

Figure 14:
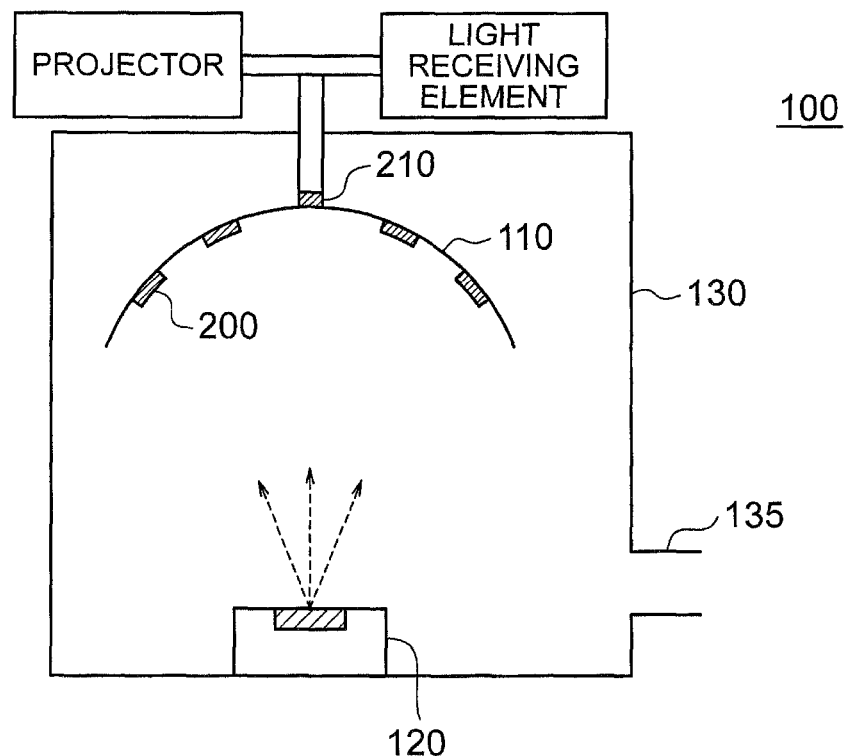
FIG. 14 illustrates optical monitoring of deposition process.
Figure 15A:
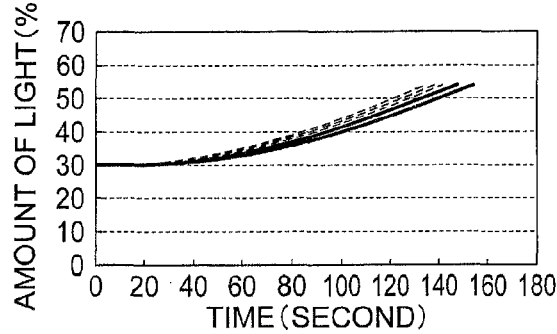
FIGS. 15A to 15D represent relationships between processing time and amounts of reflected light of the first film layer to the fourth film layer, respectively.
Figure 15B:
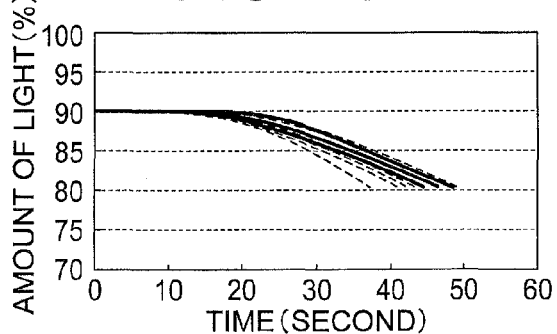
Figure 15C:
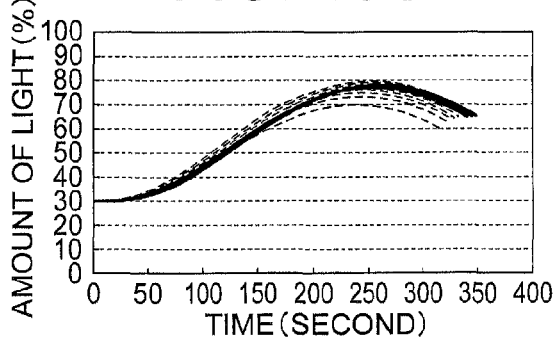
Figure 15D:
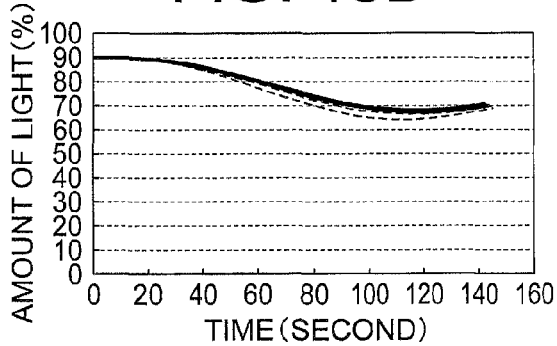

FIG. 14 illustrates optical monitoring of deposition process. A monitor glass window 210 is attached the dome 110. Light is projected onto the monitor glass window 210 at a predetermined incident angle from the back by a projector, and an amount of reflected light is measured by a light receiving element. When the degree of vacuum in the chamber changes, the refractive index of the deposited film on the monitor glass window 210 will change and therefore the amount of reflected light will change. Accordingly, by measuring the amount of reflected light, a change of the degree of vacuum in the chamber can be monitored.

FIGS. 15A to 15D represent relationships between processing time and amounts of reflected light of the first film layer to the fourth film layer, respectively. The horizontal axis represents processing time while the vertical axis represent amount of reflected light, which is measured by the light receiving element. In FIGS. 15A to 15D, solid lines represent the relationships in the case of the deposition apparatus according to the present invention, while dashed lines represent the relationships in the case of the conventional deposition apparatus. 100% of amount of light corresponds to the amount of the projected light. The amounts of reflected light in the case of the deposition apparatus according to the present invention do not substantially differ from the amounts of reflected light in the case of the conventional deposition apparatus. Considering an amount of reflected light will change accordingly if the operational condition of the deposition process, that is, the degree of vacuum of the chamber changes, the operational condition of the deposition process of the deposition apparatus according to the present invention does not differ from that of the conventional deposition apparatus.

Thus, the deposition apparatus according to the present invention shows higher throughput while quality of optical elements produced by it is not different from that of optical elements produced by conventional deposition apparatuses.

In the description given above, the tray holder holds there trays. In general, the tray holder may hold four or more trays.

What is claimed is:

1. A deposition apparatus comprising:
   a deposition source;
   a rotatable dome which covers the deposition source and is provided with an opening, the rotatable dome being capable of rotating around a first axis;
   a first lever provided outside of the dome; and
   a tray holder which is provided with a frame and a rotating part, the frame being provided with a first rotating member, the rotating part being provided with a second rotating member and being attached to the frame such that the rotating part is capable of rotating together with the second rotating member around a second axis supported by the frame;
   wherein the rotating part is provided with a plurality of work-holding trays arranged around the second axis,
   the tray holder is installed on the dome such that a side of one of the plurality of work-holding trays covers the opening,
   the first rotating member is configured such that the first rotating member is rotated around a third axis by the first lever during rotation of the dome, and
   the second rotating member is configured such that the second rotating member is rotated around the second axis together with the rotating part by the first rotating member so as to change the side of one of the plurality of work-holding trays which covers the opening to another side of one of the plurality of work-holding trays, and
   wherein the first axis, the second axis and the third axis are different from each other.

2. A deposition apparatus according to claim 1, wherein the first lever is configured such that the position can be switched between a standby position in which the first lever is not brought into contact with the first rotating member during rotation of the dome and a working position in which the first lever is brought into contact with the first rotating member during rotation of the dome, and
   the first rotating member is configured such that the first rotating member is rotated by the first lever during rotation of the dome when the first lever is in the working position.

3. A deposition apparatus according to claim 1, further comprising a tray-detecting contact installed outside of the dome,
   wherein the rotating part is further provided with tray indicating contacts each of which corresponds to one of the plurality of work-holding trays and which are to be brought into contact with the tray-detecting contact during rotation of the dome.

4. A deposition apparatus according to claim 1, further comprising a second lever installed outside of the dome, wherein the rotating part is further provided with third rotating members each of which corresponds to one of the plurality of work-holding trays, each of the plurality of work-holding trays is provided with a fourth rotating member and is attached to the rotating part such that each of the plurality of work-holding trays is capable of rotating together with the fourth rotating member around a fourth axis supported by the rotating part, the third rotating members are configured to rotate by the second lever during rotation of the dome, and the fourth rotating member is configured such that the fourth rotating member is rotated together with each of the plurality of work-holding trays by one of the third rotating members so as to turn over each of the plurality of work-holding trays.

5. A deposition apparatus according to claim 4, wherein the second lever is configured such that the position can be switched between a standby position in which the second lever is not brought into contact with the third rotating members during rotation of the dome and a working position in which the second lever is brought into contact with the third rotating members during rotation of the dome, and the third rotating members are configured such that the third rotating members are rotated by the second lever during rotation of the dome when the second lever is in the working position.

6. A deposition apparatus according to claim 4, further comprising a tray-side detecting contact installed outside of the dome, wherein each of the plurality of work-holding trays is further provided with tray-side indicating contacts each of which is to be brought into contact with the tray-side detecting contact during rotation of the dome.

7. A deposition apparatus according to claim 1, further comprising a home-position detecting contact installed outside of the dome and a plurality of tray holders, wherein one of the plurality of tray holders is provided with a contact for indicating the home position of rotation, and the contact is to be brought into contact with the home-position detecting contact during rotation of the dome.

8. A deposition apparatus according to claim 1, wherein the rotating part is provided with three work-holding trays.

* * * * *